US012221695B2

(12) United States Patent
Mentovich et al.

(10) Patent No.: US 12,221,695 B2
(45) Date of Patent: Feb. 11, 2025

(54) CVD SYSTEM WITH FLANGE ASSEMBLY FOR FACILITATING UNIFORM AND LAMINAR FLOW

(71) Applicants: MELLANOX TECHNOLOGIES, LTD., Yokneam (IL); BAR-ILAN UNIVERSITY, Ramat Gan (IL); RAMOT AT TEL-AVIV UNIVERSITY LTD., Tel Aviv (IL); SIMTAL NANO-COATINGS LTD, Shimshit (IL)

(72) Inventors: Elad Mentovich, Tel Aviv (IL); Yaniv Rotem, Nesher (IL); Yaakov Gridish, Yoqneam Ilit (IL); Doron Naveh, Petah-Tikva (IL); Chen Stern, Kiryat Ono (IL); Yosi Ben-Naim, Eilat (IL); Ariel Ismach, Rosh Haain (IL); Eran Bar-Rabi, Shimshit (IL); Tal Kaufman, Shimshit (IL)

(73) Assignees: MELLANOX TECHNOLOGIES, LTD., Yokneam (IL); BAR-ILAN UNIVERSITY, Yokneam (IL); RAMOT AT TEL-AVIV UNIVERSITY LTD., Tel Aviv (IL); SIMTAL NANO-COATINGS LTD, Shimshit (IL)

( * ) Notice: Subject to any disclaimer, the term of this patent is extended or adjusted under 35 U.S.C. 154(b) by 894 days.

(21) Appl. No.: 17/305,209

(22) Filed: Jul. 1, 2021

(65) Prior Publication Data

US 2022/0372622 A1 Nov. 24, 2022

Related U.S. Application Data

(60) Provisional application No. 63/201,910, filed on May 18, 2021.

(51) Int. Cl.
*C23C 16/455* (2006.01)
*C23C 16/46* (2006.01)
*F15D 1/06* (2006.01)

(52) U.S. Cl.
CPC .. *C23C 16/45504* (2013.01); *C23C 16/45591* (2013.01); *C23C 16/46* (2013.01); *F15D 1/06* (2013.01)

(58) Field of Classification Search
CPC .............. C23C 16/46; C23C 16/45504; C23C 16/4409; C23C 16/45591; C23C 16/45561; C23C 16/45563; F15D 1/06
See application file for complete search history.

(56) References Cited

U.S. PATENT DOCUMENTS

| 3,672,948 A | 6/1972 | Foehring |
| 4,417,722 A | 11/1983 | Ishii |

(Continued)

FOREIGN PATENT DOCUMENTS

| CN | 105779961 A | 7/2016 |
| DE | 112013006022 T5 | 9/2015 |

(Continued)

OTHER PUBLICATIONS

Steinberg et al., pending U.S. Appl. No. 18/200,314, filed May 22, 2023.

(Continued)

*Primary Examiner* — Yuechuan Yu
(74) *Attorney, Agent, or Firm* — Michele M. Glessner; Moore & Van Allen PLLC (57) ABSTRACT

A first and a second flange assembly configured for facilitating uniform and laminar flow in a system are provided. The first flange assembly includes a first flange body configured to introduce a gas into a chamber. The first flange assembly includes a plurality of outlet tubes disposed on an (Continued)

interior surface of the first flange body and a plurality of inlet tubes disposed on an exterior surface of the first flange body and in fluid communication with the plurality of outlet tubes. The second flange assembly includes a second flange body configured to remove the gas from the chamber. The second flange assembly includes a plurality of through holes extending from an interior surface to an exterior surface of the second flange body and a plurality of exit tubes extending from the exterior surface of the second flange body and in fluid communication with the plurality of through holes.

20 Claims, 6 Drawing Sheets

(56) References Cited

U.S. PATENT DOCUMENTS

| | | |
|---|---|---|
| 4,450,034 A | 5/1984 | Stern |
| 4,455,181 A | 6/1984 | Lifshin et al. |
| 4,931,425 A | 6/1990 | Kimura |
| 5,108,532 A | 4/1992 | Thein et al. |
| 5,256,474 A | 10/1993 | Johnston |
| 6,117,266 A | 9/2000 | Horzel et al. |
| 6,432,239 B1 | 8/2002 | Mandai et al. |
| 7,798,096 B2 * | 9/2010 | Mahajani ............ C23C 16/509 118/723 E |
| 9,215,797 B2 | 12/2015 | Mori et al. |
| 9,384,875 B2 | 7/2016 | Kimura et al. |
| 9,431,487 B2 | 8/2016 | Bol et al. |
| 9,924,619 B2 | 3/2018 | Kim et al. |
| 10,022,947 B2 | 7/2018 | Kimura et al. |
| 10,518,506 B2 | 12/2019 | Miyazono et al. |
| 10,717,260 B2 | 7/2020 | Shimizu et al. |
| 11,105,567 B2 | 8/2021 | Fan et al. |
| 2005/0112344 A1 | 5/2005 | Redfern et al. |
| 2006/0042059 A1 | 3/2006 | Satoh |
| 2008/0173238 A1 * | 7/2008 | Nakashima ......... C23C 16/4584 438/758 |
| 2010/0047447 A1 | 2/2010 | Cook |
| 2010/0068383 A1 * | 3/2010 | Kato ................ C23C 16/45546 118/728 |
| 2010/0068893 A1 * | 3/2010 | Kato ................ H01L 21/67757 438/758 |
| 2010/0196124 A1 | 8/2010 | Fukuma et al. |
| 2011/0076118 A1 | 3/2011 | Kurita et al. |
| 2011/0091646 A1 | 4/2011 | Aliatieh |
| 2011/0123776 A1 | 5/2011 | Shin et al. |
| 2013/0108839 A1 | 5/2013 | Arnold et al. |
| 2013/0189635 A1 | 7/2013 | Lim |
| 2013/0248229 A1 | 9/2013 | Martens |
| 2013/0299077 A1 | 11/2013 | Hong |
| 2013/0344246 A1 | 12/2013 | Li |
| 2014/0053973 A1 | 2/2014 | Shin et al. |
| 2015/0064470 A1 | 3/2015 | Kimura et al. |
| 2015/0123080 A1 | 5/2015 | Yamaguchi |
| 2015/0360370 A1 | 12/2015 | Mazzocco et al. |
| 2016/0027935 A1 | 1/2016 | Naito et al. |
| 2016/0049475 A1 | 2/2016 | Bol et al. |
| 2016/0076829 A1 | 3/2016 | Lee et al. |
| 2016/0079001 A1 | 3/2016 | Lin et al. |
| 2016/0093478 A1 | 3/2016 | Guo |
| 2017/0029279 A1 | 2/2017 | Kim |
| 2017/0125136 A1 | 5/2017 | Park et al. |
| 2017/0130336 A1 | 5/2017 | Fujikura |
| 2017/0207484 A1 | 7/2017 | Zhamu et al. |
| 2017/0211706 A1 | 7/2017 | Amir |
| 2017/0273181 A1 | 9/2017 | Sohn et al. |
| 2017/0290167 A1 | 10/2017 | Pun et al. |
| 2017/0338312 A1 | 11/2017 | Treossi et al. |
| 2019/0047262 A1 | 2/2019 | Minakuchi et al. |
| 2019/0143369 A1 | 5/2019 | Lin et al. |
| 2019/0143656 A1 | 5/2019 | Lin et al. |
| 2019/0145007 A1 | 5/2019 | Lin et al. |
| 2019/0283377 A1 | 9/2019 | Lin et al. |
| 2019/0283378 A1 | 9/2019 | Lin et al. |
| 2019/0283379 A1 | 9/2019 | Lin et al. |
| 2019/0284712 A1 | 9/2019 | Lin et al. |
| 2019/0292675 A1 | 9/2019 | Lin et al. |
| 2019/0292676 A1 | 9/2019 | Lin et al. |
| 2019/0292720 A1 | 9/2019 | Lin et al. |
| 2019/0292721 A1 | 9/2019 | Lin et al. |
| 2019/0292722 A1 | 9/2019 | Lin et al. |
| 2019/0332015 A1 | 10/2019 | Poiesz et al. |
| 2021/0091368 A1 | 3/2021 | House et al. |
| 2021/0091383 A1 | 3/2021 | House et al. |
| 2021/0100090 A1 | 4/2021 | Chang |
| 2021/0125850 A1 | 4/2021 | Chen et al. |
| 2021/0139700 A1 | 5/2021 | Arimoto et al. |
| 2021/0184181 A1 | 6/2021 | Ding |
| 2021/0260859 A1 | 8/2021 | Le Rhun et al. |
| 2022/0131040 A1 | 4/2022 | Chen et al. |
| 2022/0161537 A1 | 5/2022 | Quellmalz et al. |
| 2022/0169002 A1 | 6/2022 | Honda et al. |
| 2022/0204348 A1 | 6/2022 | Gao et al. |
| 2022/0372621 A1 | 11/2022 | Mentovich |
| 2022/0377907 A1 | 11/2022 | Mentovich |
| 2022/0377912 A1 | 11/2022 | Atias |
| 2023/0002906 A1 | 1/2023 | Mentovich |
| 2023/0007788 A1 | 1/2023 | Atias |
| 2023/0007789 A1 | 1/2023 | Mentovich |

FOREIGN PATENT DOCUMENTS

| | | |
|---|---|---|
| EP | 3723122 A1 | 10/2020 |
| KR | 20190058231 A | 5/2019 |
| WO | 2015062760 A1 | 5/2015 |
| WO | 2020152358 A1 | 7/2020 |

OTHER PUBLICATIONS

Steinberg et al., pending U.S. Appl. No. 18/200,352, filed May 22, 2023.
Chinese Office Action from corresponding Chinese Application No. 202210515308.4 dated Oct. 28, 2023, 4 pages, with English Translation.
Zuo Dunwen, "Modern Processing Technology," Beijing University of Aeronautics and Astronautics Press, pp. 299-301, Mar. 31, 2005.
Xu Binshi, "Material Surface Engineering," Harbin Institute of Technology Press, p. 300, Dec. 31, 2014.

* cited by examiner

CVD SYSTEM WITH FLANGE ASSEMBLY FOR FACILITATING UNIFORM AND LAMINAR FLOW

CROSS-REFERENCE TO RELATED APPLICATIONS

This application claims priority to U.S. Provisional Patent Application No. 63/201,910, filed May 18, 2021, the contents of which are incorporated herein by reference in their entirety.

TECHNOLOGICAL FIELD

Example embodiments of the present disclosure relate generally to a chemical vapor deposition system and more particularly to a chemical vapor deposition system that includes a first flange assembly and a second flange assembly for facilitating uniform and laminar flow.

BACKGROUND

Chemical vapor deposition is an industrial process used to deposit a thin film of a desired material onto a substrate for use in a variety of technical applications. Applicant has identified a number of deficiencies and problems associated with present systems and methods for performing chemical vapor deposition. Through applied effort, ingenuity, and innovation, many of these identified problems have been solved by developing solutions that are included in embodiments of the present disclosure, many examples of which are described in detail herein.

BRIEF SUMMARY

In an embodiment, a flange assembly for introducing at least one gas into a chemical vapor deposition chamber is provided. The flange assembly comprises a flange body disposed within a chemical vapor deposition chamber, where the flange body defines a length and has an interior surface and an exterior surface. The flange assembly further comprises a plurality of outlet tubes disposed on the interior surface of the flange body. The flange assembly further comprises a plurality of inlet tubes disposed on the exterior surface of the flange body, each inlet tube having a first end and a second end, where each inlet tube is in fluid communication with a corresponding outlet tube via the second end of the inlet tube, where the first end of each inlet tube is configured to be connected to a supply of the at least one gas, and each outlet tube is configured to output the at least one gas into the chemical vapor deposition chamber for conducting a chemical vapor deposition process.

In some embodiments, the plurality of outlet tubes are circumferentially disposed on the interior surface of the flange body and extend along the length of the flange body. In some embodiments, the plurality of inlet tubes extend radially outward from the exterior surface of the flange body.

In some embodiments, the flange assembly a diameter of each outlet tube is greater than a diameter of each inlet tube.

In some embodiments, each outlet tube defines a first end and a second end, and each outlet tube is configured to output the at least one gas into the chemical vapor deposition chamber via an opening at the first end.

In some embodiments, the flange assembly further comprises flexible bellows engaged with the flange body. In some embodiments, the flange assembly further comprises an O-ring engaged with the flange body.

In another embodiment, a flange assembly for removing at least one gas from a chemical vapor deposition chamber is provided. The flange assembly comprises a flange body disposed within a chemical vapor deposition chamber, where the flange body has an interior surface and an exterior surface and defines a plurality of through holes between the interior surface and the exterior surface. The flange assembly further comprises a plurality of exit tubes extending from the exterior surface of the flange body, where each of the exit tubes is aligned with a corresponding one of the plurality of through holes so as to be in fluid communication with an interior of the chemical vapor deposition chamber, and where at least one of the plurality of exit tubes and corresponding through hole is positioned opposite another one of the plurality of exit tubes and corresponding through hole with respect to a midline of the flange body.

In some embodiments, at least one of the plurality of exit tubes is connected to another one of the plurality of exit tubes via a first intermediary tube. In some embodiments, the first intermediary tube is in fluid communication with a pump.

In some embodiments, the flange assembly further comprises flexible bellows engaged with the flange body. In some embodiments, the flange assembly further comprises an O-ring engaged with the flange body.

In yet another embodiment, a chamber for conducting chemical vapor deposition is provided. The chamber comprises a heating enclosure configured to maintain a substrate at a predefined temperature for conducting a chemical vapor deposition process within the chamber, where the heating enclosure comprises a body having a first end and a second end. The chamber further comprises a first flange body disposed within the chamber proximate the first end of the body of the heating enclosure and configured to introduce at least one gas into the chamber, where the first flange body defines a length and has an interior surface and an exterior surface. The chamber further comprises a plurality of outlet tubes disposed on the interior surface of the first flange body. The chamber further comprises a plurality of inlet tubes disposed on the exterior surface of the first flange body, each inlet tube having a first end and a second end, where each inlet tube is in fluid communication with a corresponding outlet tube via the second end of the inlet tube, where the first end of each inlet tube is configured to be connected to a supply of the at least one gas, and where each outlet tube is configured to output the at least one gas into the chamber proximate the first end of the body of the heating enclosure. The chamber further comprises a second flange body disposed within the chamber proximate the second end of the body of the heating enclosure and configured to remove the at least one gas from the chamber, where the second flange body has an interior surface and an exterior surface and defines a plurality of through holes between the interior surface and the exterior surface. The chamber further comprises a plurality of exit tubes extending from the exterior surface of the second flange body, where each of the exit tubes is aligned with a corresponding one of the plurality of through holes so as to be in fluid communication with an interior of the chamber, where at least one of the plurality of exit tubes and corresponding through hole is positioned opposite another one of the plurality of exit tubes and corresponding through hole with respect to a midline of the second flange body, and where the first flange body and the second flange body are configured to facilitate substantially uniform and laminar flow of the at least one gas over the substrate.

In some embodiments, a diameter of each outlet tube is greater than a diameter of each inlet tube.

In some embodiments, the plurality of outlet tubes are circumferentially disposed on the interior surface of the first flange body and extend along the length of the first flange body and the plurality of inlet tubes extend radially outward from the exterior surface of the first flange body.

In some embodiments, each outlet tube is further configured to output the at least one gas into the chamber via an opening at a first end.

In some embodiments, the chamber further comprises first flexible bellows engaged with the first flange body and second flexible bellows engaged with the second flange body.

In some embodiments, the chamber further comprises a first O-ring engaged with the first flange body and a second O-ring engaged with the second flange body.

In some embodiments, at least one of the plurality of exit tubes is connected to another one of the plurality of exit tubes via a first intermediary tube and the first intermediary tube is in fluid communication with a pump.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

Chemical vapor deposition (CVD) is an industrial process that uses chemical reactions to deposit a thin film of a desired material onto a substrate for use in a variety of technical applications. In many conventional CVD systems, a substrate may be placed inside a reactive chamber of the CVD system. Once the substrate is inside the reactive chamber, the pressure in the reactive chamber may be adjusted to ensure that the pressure is at substantially vacuum pressure, and the temperature in the reactive chamber is increased to a necessary reactive temperature. Then, deposition gases are introduced into the reactive chamber causing a reaction to occur that deposits a thin film of the desired material onto the substrate. After enough of the desired material has been deposited onto the substrate, the deposition gases are removed from the reactive chamber, the temperature is reduced to a safe handling temperature, and the pressure in the reactive chamber may be adjusted to allow for the substrate to be removed from the reactive chamber.

In order to produce high-quality sheets of the desired material using the CVD process described above, it is essential that the desired material is deposited uniformly onto the substrate. To obtain uniform deposition, it is necessary for the reaction to occur evenly at all points on the substrate. This can be achieved by promoting substantially uniform and laminar flow of the deposition gases over the substrate. Laminar flow is a type of gas flow in which the gas flows in lines or layers such that there is no disruption between the lines or layers nor turbulence, vortices, or compressible movement, such that the velocity of the molecules of the gas slowly varies in space with a smooth, continuous divergence. In uniform flow, the properties and flux of the gas, have high uniformity across the cross-section of the gas. In other words, promoting substantially uniform and laminar flow of the deposition gases over the substrate ensures that there is an even spread of the deposition gas over the entire surface of the substrate, thus, enabling uniform deposition of the desired material onto the substrate.

In many conventional CVD systems, as described above, the deposition gases are introduced at a first end of the reactive chamber. The deposition gases may then pass over the substrate causing the reaction to occur and depositing the material onto the substrate. Then, the deposition gases may be removed from the reactive chamber at a second end of the reactive chamber. However, in such conventional CVD systems, the introduction and removal of the deposition gases may introduce substantial turbulence into the flow of the deposition gases, at least (or most significantly) in the areas closest to the locations where the deposition gases are introduced and removed (e.g. start and end of the reactive chamber). To combat this turbulence and ensure substantially uniform and laminar flow of the deposition gases over the substrate, such conventional CVD systems are either designed to provide a long length of empty reactive chamber between the point of introduction of the deposition gases and the substrate and another long length of empty reactive chamber between the substrate and the point of removal of the deposition gases and/or include a shower head disposed inside the reactive chamber and configured to introduce the deposition gases into the reactive chamber. The long lengths of empty chamber ensure that when the deposition gases reach the substrate, the turbulence caused by the introduction and removal of the deposition gases is no longer present. Thus, these long lengths of empty chamber cause the reactive chamber to be large relative to the size of the substrate being processed, thus increasing costs and wasting valuable floor space. Further, the shower head, which may be disposed at the first end of the chamber, helps ensure that the deposition gases are introduced into the reactive chamber without turbulence. However, the shower head may waste valuable space inside the reactive chamber and also complicate the introduction of the substrate into the reactive chamber, thus, increasing costs and reducing the amount of the desired material that can be produced in a given space and time frame.

Thus, to address the above identified issues of conventional CVD systems and methods, a CVD system that enables substantially uniform and laminar flow of gas without requiring long lengths of empty chamber or a shower head disposed inside the reactive chamber is disclosed herein. In some embodiments, the CVD system may be a continuous feed CVD system, such as the system described in the application titled CONTINUOUS-FEED CVD SYSTEM, Ser. No. 17/305,203, filed concurrently with the present application and the contents of which are hereby incorporated by reference in their entirety. Further, in some embodiments, the CVD system may include a substrate carrier and associated mechanisms for moving the substrate through the CVD system, such as the substrate carrier and associated mechanisms described in the application titled CVD SYSTEM WITH SUBSTRATE CARRIER AND ASSOCIATED MECHANISMS FOR MOVING SUBSTRATE THERETHROUGH, Ser. No. 17/305,206, filed concurrently with the present application and the contents of which are hereby incorporated by reference in their entirety. Further, in some embodiments, the CVD system may be used to perform several types of processes, such as the processes described in the applications titled PROCESS FOR LAMINATING GRAPHENE-COATED PRINTED CIRCUIT BOARDS, Ser. No. 17/305,205; PROCESS FOR LAMINATING CONDUCTIVE-LUBRICANT COATED METALS FOR PRINTED CIRCUIT BOARDS, Ser. No. 17/305,223; PROCESS FOR LOCALIZED REPAIR OF GRAPHENE-COATED LAMINATION STACKS AND PRINTED CIRCUIT BOARDS, Ser. No. 17/305,233; PROCESS FOR APPLYING A TWO-DIMENSIONAL MATERIAL TO A TARGET SUBSTRATE POST-LAMINATION, Ser. No. 17/305,238; each of which is filed concurrently with the present application. The contents of each of the foregoing applications are hereby incorporated by reference in their entirety.

The CVD system includes a process chamber configured for performing a CVD process on a substrate. As described herein, the process chamber may include a first gate valve configured to allow for the substrate to be received into the CVD system and a second gate valve configured to allow for the discharge, or removal, of the substrate from the CVD system. The process chamber may further include a heating enclosure configured for containing the substrate during the CVD process and maintaining the necessary reactive temperature around the substrate during the CVD process. The process chamber may further include a unique first tubular connector disposed between the first gate valve and the heating enclosure and a unique second tubular connector disposed between the second gate valve and the heating enclosure. The first tubular connector may be configured to introduce at least one gas into the process chamber via a first flange assembly and the second tubular connector may be configured to remove the at least one gas from the process chamber via a second flange assembly. The first tubular connector and the second tubular connector may be configured to introduce and remove the at least one gas from the process chamber with minimal or no turbulence, such that the at least one gas may flow over the substrate in a substantially uniform and laminar manner without the need for long lengths of empty process chamber or a shower head disposed inside the process chamber.

While embodiments of the invention and as described in greater detail below may be applied to CVD processes for depositing a variety of materials, embodiments of the invention described herein may be advantageous in the production of high-quality graphene. Graphene is a two-dimensional allotrope of carbon that comprises a single layer of carbon atoms arranged in a hexagonal honeycomb lattice. Graphene possess a unique combination of electromagnetic, thermal, and structural properties, such that graphene has the potential to revolutionize a variety of technologies, including electronic devices, optoelectronic devices, light emitting diodes, touch screens, electrical contacts, flexible electrodes, transparent electrodes, supercapacitors, batteries, Q-bit computing, optical sensors, chemical sensors, etc. However, successful implementation of graphene in such technologies has been severely limited by the inability of conventional CVD systems to produce high-quality graphene in a compact and cost-effective manner. Embodiments of the invention disclosed herein and described in greater detail below enable the production of high-quality graphene in a compact and cost-effective manner.

CVD System

Figure 1:
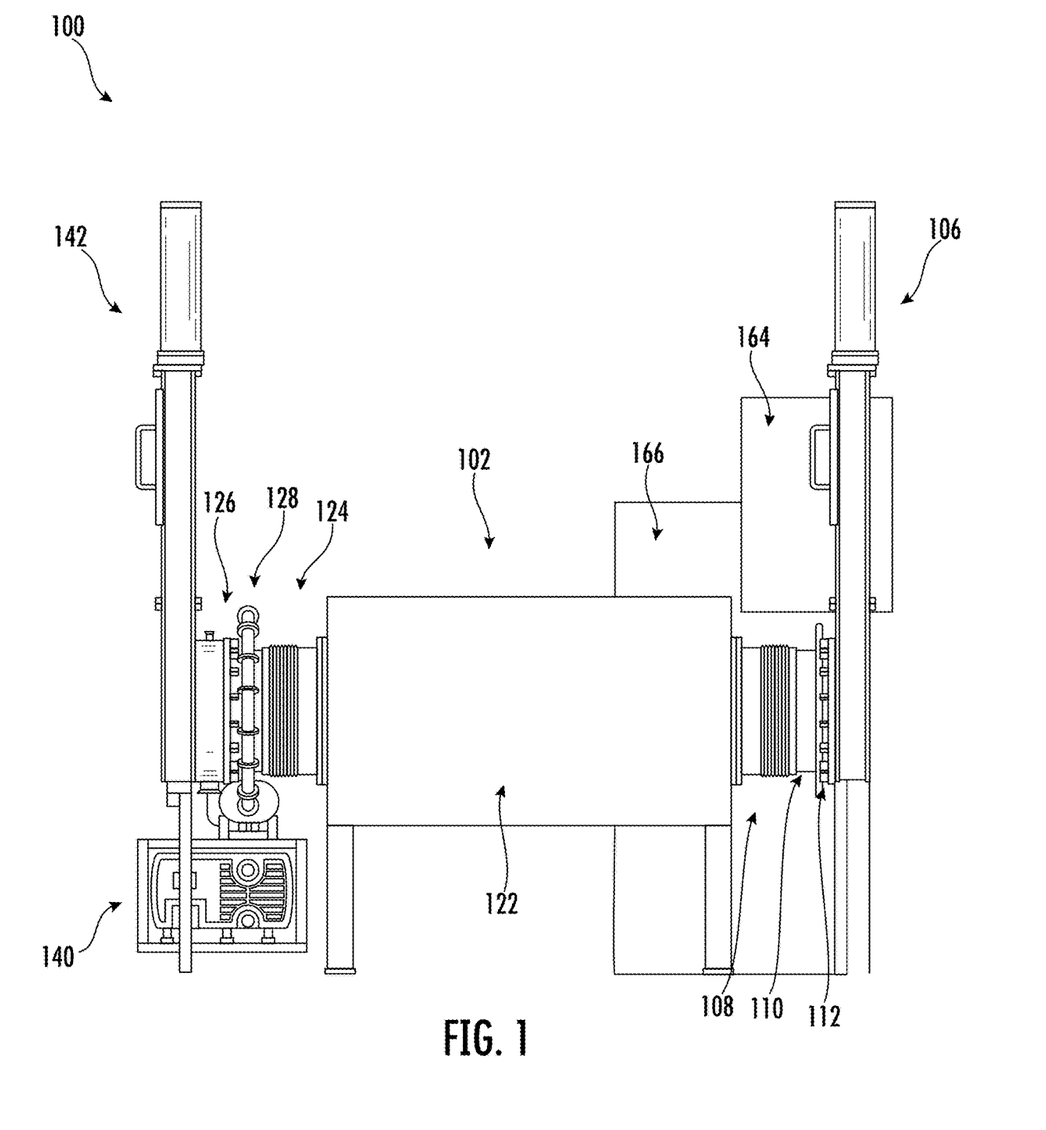
FIG. 1 illustrates an example chemical vapor deposition system in accordance with one or more embodiments of the present invention.
Figure 2:
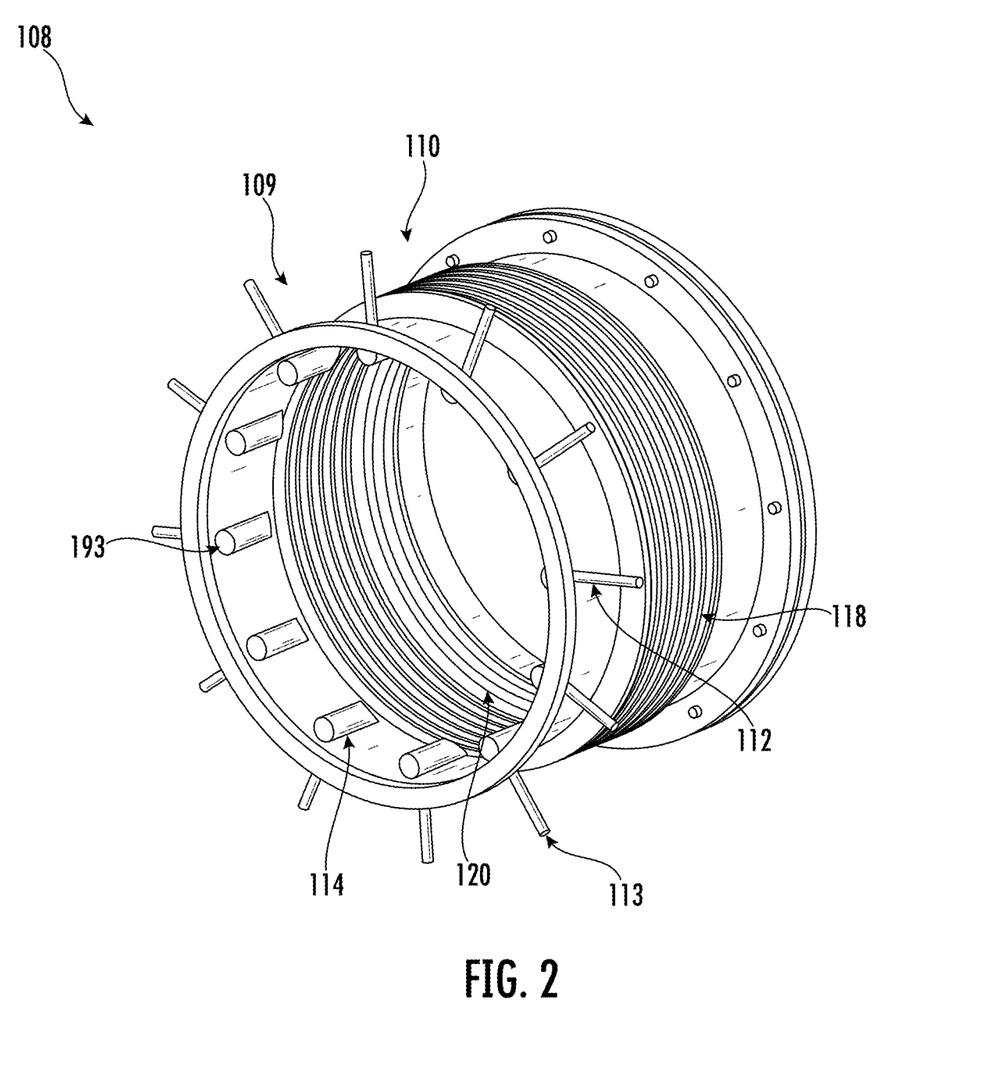
FIG. 2 is a perspective view of a first tubular connector in accordance with one or more embodiments of the present invention.

With reference to FIG. 1, a CVD system 100 is illustrated. As shown, embodiments of the CVD system 100 may include a process chamber 102 configured for performing a CVD process on the substrate. As described herein, the process chamber 102 may be configured to receive the substrate through a first gate valve 106 and to discharge, or allow for the removal of, the substrate through a second gate valve 142. For example, the substrate may be passed through the first gate valve 106 and into the process chamber 102 from an upstream chamber (not shown), and the first gate valve 106 may be closed during the CVD process to isolate the process chamber 102 from the upstream chamber or other upstream portions of the CVD system 100. Likewise, after the CVD process is complete, the substrate may be passed through the second gate valve 142 from the process chamber 102 to a downstream chamber (not shown). The second gate valve 142 may be closed during the CVD process to isolate the process chamber 102 from the downstream chamber or other downstream portions of the CVD system 100.

The process chamber 102 may further include a heating enclosure 122 configured for containing the substrate during the CVD process and maintaining the necessary reactive temperature around the substrate during the CVD process. The process chamber 102 may further include a first tubular connector 108 disposed between the first gate valve 106 and the heating enclosure 122. The first tubular connector 108 may be configured to introduce at least one gas into the process chamber 102, as described in greater detail below. The process chamber 102 may further include a second tubular connector 124 disposed between the heating enclosure 122 and the second gate valve 142. The second tubular connector 124 may be configured for removing the at least one gas from the process chamber 102, as described in greater detail below.

As described herein, the substrate may comprise copper, nickel, cobalt, tungsten, silicon carbide, palladium, platinum, gold, or transition metal alloys. Said differently, the substrate may be any material upon which a CVD process can be performed. In some embodiments, the process chamber 102 may only contain one substrate at a time. In other embodiments, the process chamber 102 may contain a plurality of substrates (e.g., a batch of substrates) for processing at the same time. In some embodiments, the substrate may be inserted directly into the CVD system 100. In other embodiments, the substrate(s) may be initially placed in a substrate carrier, and the substrate carrier may be inserted or otherwise convey the substrate(s) into the CVD system 100.

As described above and depicted in the figures, the substrate may be received into the process chamber 102 through the first gate valve 106 at a first end of the CVD system 100. In other embodiments (not shown), however, the substrate may be received into the process chamber 102 via an access port on the side of the heating enclosure 122. As noted above, the first gate valve 106 may be opened to enable the reception of the substrate within the process chamber 102. The first gate valve 106 may be closed to environmentally isolate the process chamber 102 from other parts of the CVD system 100 when the CVD process is being performed on the substrate in the process chamber 102. In this way, there may be different environmental conditions (e.g., temperature, pressure, and gas flow) within the process chamber 102 as compared to other parts of the CVD system 100 or the external environment during the CVD process. In some embodiments, the first gate valve 106 may be a different type of valve, other than a gate valve.

In some embodiments, the first gate valve 106 may be opened and closed automatically. For example, the first gate valve 106 may be configured to open and/or close based on when the CVD process within the process chamber 102 is set to start or when it is completed. In other examples, the first gate valve 106 may be configured to open based on the pressure within the process chamber 102. For example, the first gate valve 106 may be configured to open when the pressure in the process chamber 102 is substantially atmospheric. In other embodiments, the first gate valve 106 may be opened and closed manually, such as by an operator. In some embodiments a surface of the first gate valve 106 may be mirror polished. In this way, the first gate valve 106 may be thermally isolated.

Similarly, as described above, at a second end of the CVD system 100, the substrate may be discharged, or removed, from the process chamber 102 through the second gate valve 142. In other embodiments (not shown), the substrate may be discharged, or removed, from the process chamber 102 via the access port on the side of the heating enclosure 122. The second gate valve 142 may be opened to enable the discharge, or removal, of the substrate from the process chamber 102. The second gate valve 142 may be closed to environmentally isolate the process chamber 102 from other parts of the CVD system 100 when the CVD process is being performed on the substrate in the process chamber 102. In this way, there may be different environmental conditions (e.g., temperature, pressure, and gas flow) within the process chamber 102 as compared to other parts of the CVD system 100 or the external environment during the CVD process. In some embodiments, the second gate valve 142 may be a different type of valve, other than a gate valve.

In some embodiments, the second gate valve 142 may be opened and closed automatically. For example, the second gate valve 142 may be configured to open and/or close based on when the CVD process within the process chamber 102 is set to start or when it is completed. In other examples, the second gate valve 142 may be configured to open based on the pressure within the process chamber 102. For example, the second gate valve 142 may be configured to open when the pressure in the process chamber 102 is substantially atmospheric. In other embodiments, the second gate valve 142 may be opened and closed manually, such as by an operator. In some embodiments the second gate valve 142 may be actively cooled. In some embodiments, a surface of the second gate valve 142 may be mirror polished. In this way, the second gate valve 142 may be thermally isolated.

Because the uniform deposition of the desired material on the substrate is essential for the production of high-quality sheets of the desired material, the process chamber 102 is configured to introduce and remove the at least one gas from the process chamber 102 such that the at least one gas flows over the substrate in a substantially uniform and laminar manner. In this regard, the process chamber 102 may further include a first tubular connector 108 extending between the first gate valve 106 and the heating enclosure 122 that is configured to introduce the at least one gas into the process chamber 102 via a first flange assembly 110 and a second tubular connector 124 extending between the second gate valve 142 and the heating enclosure 122 that is configured to remove the at least one gas from the process chamber 102 via a second flange assembly 126.

As shown in FIGS. 1-4, the first tubular connector 108 may include the first flange assembly 110, which includes a first flange body 109 having an interior surface 190 and an exterior surface 191. By way of example, the first flange body 109 may comprise stainless steel, aluminum, titanium, nickel, molybdenum, tungsten, or quartz. In some embodiments, the first flange body 109 may be substantially cylindrical. In other embodiments, the first flange body 109 may be substantially rectangular or have some other shape suitable for the application.

Figure 3:
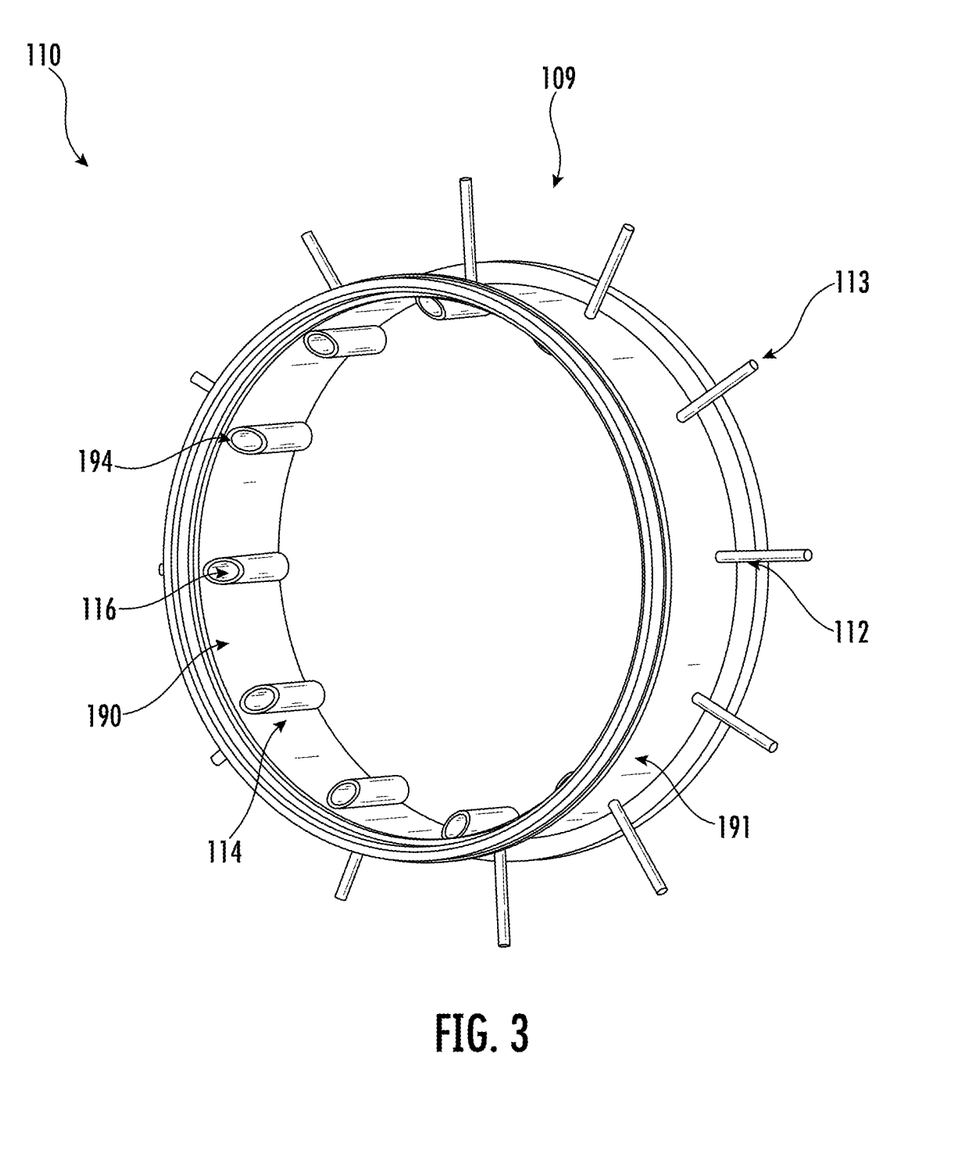
FIG. 3 is a perspective view of a first flange assembly in accordance with one or more embodiments of the present invention.
Figure 4A:
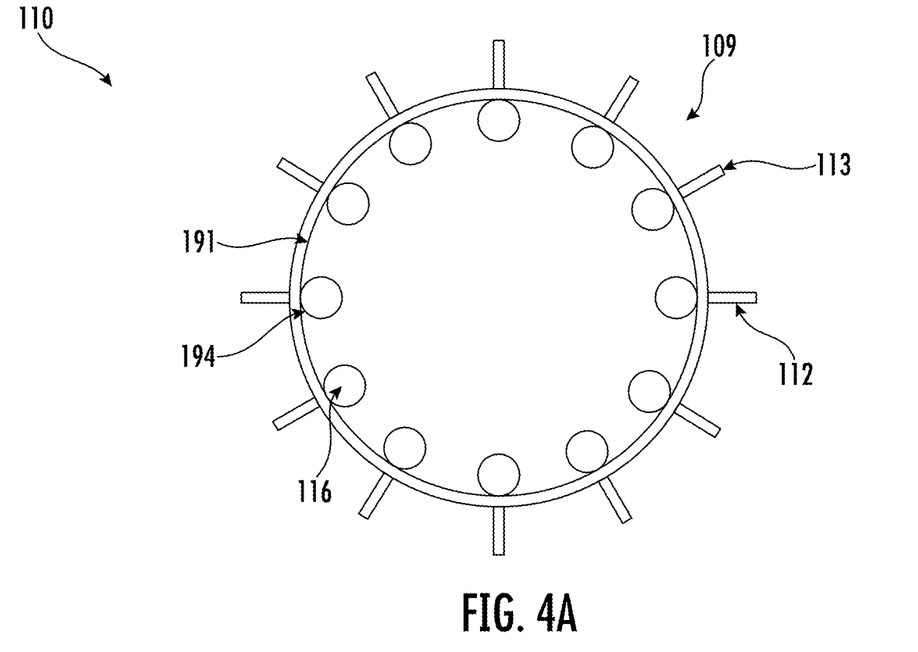
FIG. 4A is a cross-sectional view of the first flange assembly shown in FIG. 3 in accordance with one or more embodiments of the present invention.

The first flange assembly 110 may include a plurality of outlet tubes 114, each outlet tube having a first end 193 and a second end 194. The outlet tubes 114 may be disposed on the interior surface 190 of the first flange body 109. In some embodiments, as shown in FIG. 4A, the plurality of outlet tubes 114 may be circumferentially disposed (e.g. positioned in a circular arrangement along the circumference of the first flange body 109) on the interior surface 190 of the first flange body 109. In some embodiments, the plurality of outlet tubes 114 may be disposed along a length of the first flange body 109. In this way, a longitudinal axis of each outlet tube 114 may be substantially parallel to a longitudinal axis of the first flange body 109. Each outlet tube 114 may be configured to output the at least one gas into the process chamber 102 via an opening 116 defined in each outlet tube 114. In some embodiments, the opening 116 may be disposed at the second end 194 of each outlet tube 114. In some embodiments, as shown in FIG. 3, a diameter of each outlet tube 114 may be substantially the same along the length of the outlet tube 114, whereas in other embodiments, the diameter of each outlet tube 114 may vary along the length of the outlet tube 114. In some embodiments, for example, the diameter of each outlet tube 114 may increase from the first end 193 to the second end 194.

Figure 4B:
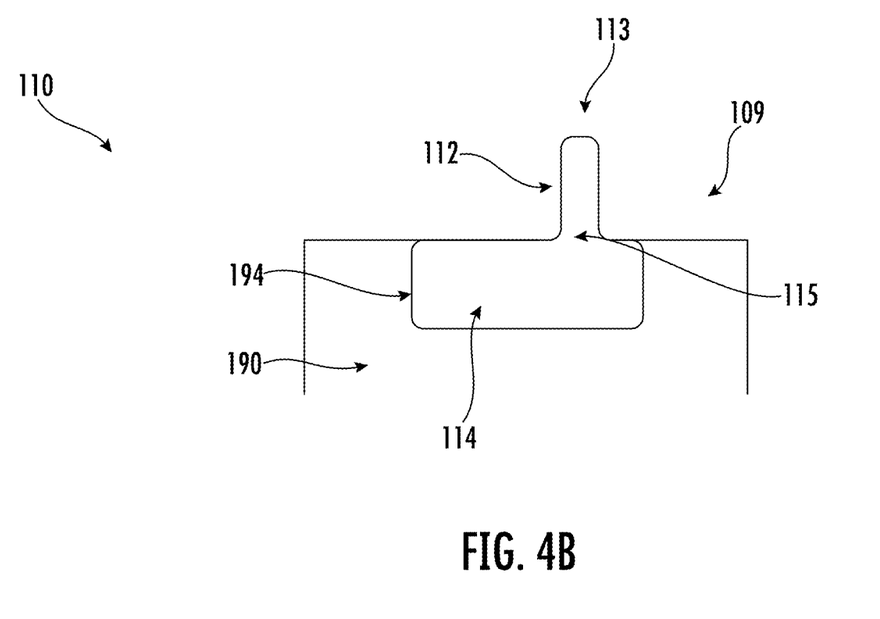
FIG. 4B is an exploded view of a longitudinal cross-sectional view of the first flange assembly shown in FIG. 3 in accordance with one or more embodiments of the present invention.

The first flange assembly 110 may further include a plurality of inlet tubes 112 disposed on the exterior surface 191 of the first flange body 109. The plurality of inlet tubes 112 may have a first end 113 and a second end 115 (shown in FIG. 4B). In some embodiments, each inlet tube 112 may be substantially perpendicular to a corresponding outlet tube 114. For example, the plurality of inlet tubes 112 may be disposed circumferentially on the exterior surface 191 of the first flange body 109 and may extend radially outward from the exterior surface 191 of first flange body 109. Each inlet tube 112 may be in fluid communication with a corresponding outlet tube 114. For example, each inlet tube 112 may be in fluid communication with a corresponding outlet tube 114 via the second end 115 of each inlet tube 112. In some embodiments, the second end 115 of each inlet tube 112 may be in fluid communication with the corresponding outlet tube 114 via the first end 193 of the outlet tube 114. In other embodiments, as shown in FIG. 4B, the second end 115 of each inlet tube 112 may be in fluid communication with the corresponding outlet tube 114 via a side of the corresponding outlet tube 114. The plurality of inlet tubes 112 may be connected to a supply of the at least one gas (not shown) via the first end 113. In some embodiments, the introduction of the at least one gas may be controlled, at least in part, via a gas control cabinet 164 (shown in FIG. 1). In some embodiments, as shown in FIG. 3, a diameter of each inlet tube 112 may be substantially the same along the length of the inlet tube 112, whereas in other embodiments, the diameter of each inlet tube 112 may be vary along the length of the inlet tube 112. In some embodiments, for example, the dimeter of each inlet tube 112 may increase from the first end 113 to the second end 115. In some embodiments, the diameter of each outlet tube 114 may be greater than the diameter of each inlet tube 112. For example, the diameter of each outlet tube 114 may be at least two times the diameter of inlet tube 112 in some embodiments.

Figure 5:
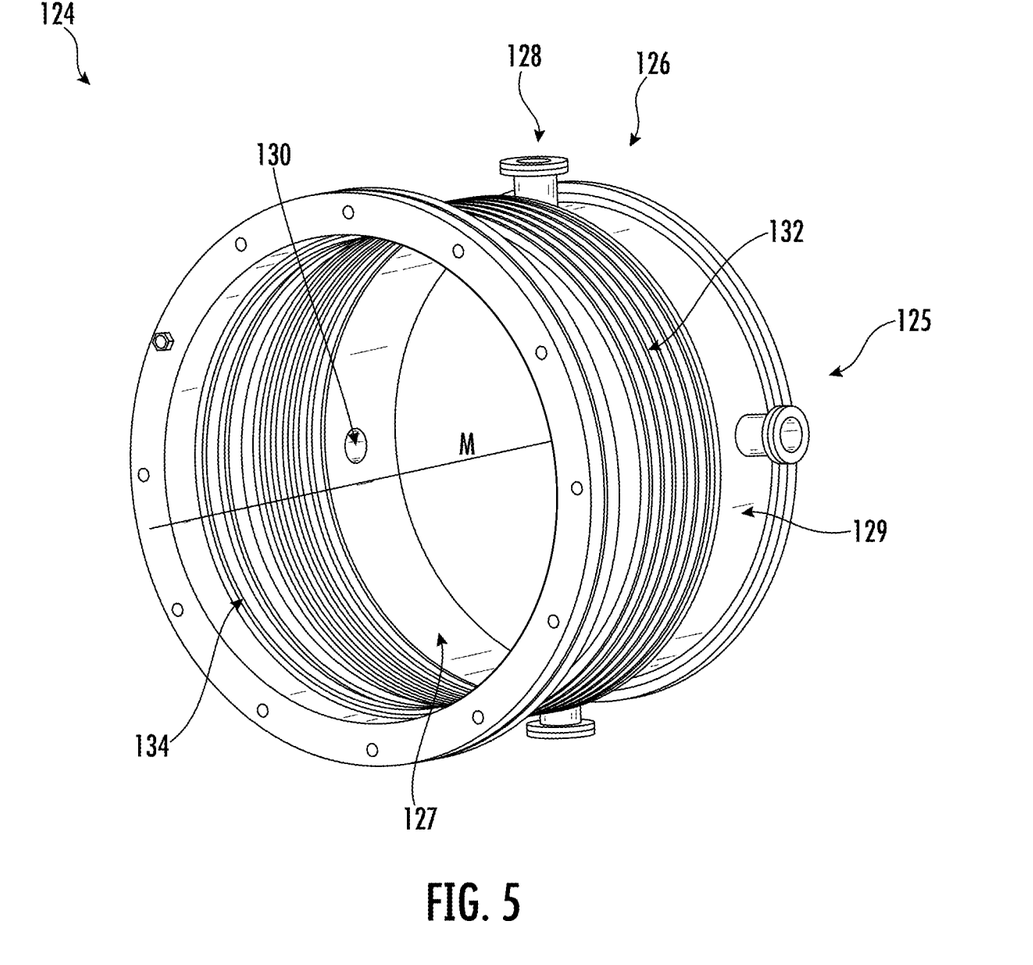
FIG. 5 is a perspective view of a second tubular connector in accordance with one or more embodiments of the present invention.
Figure 6:
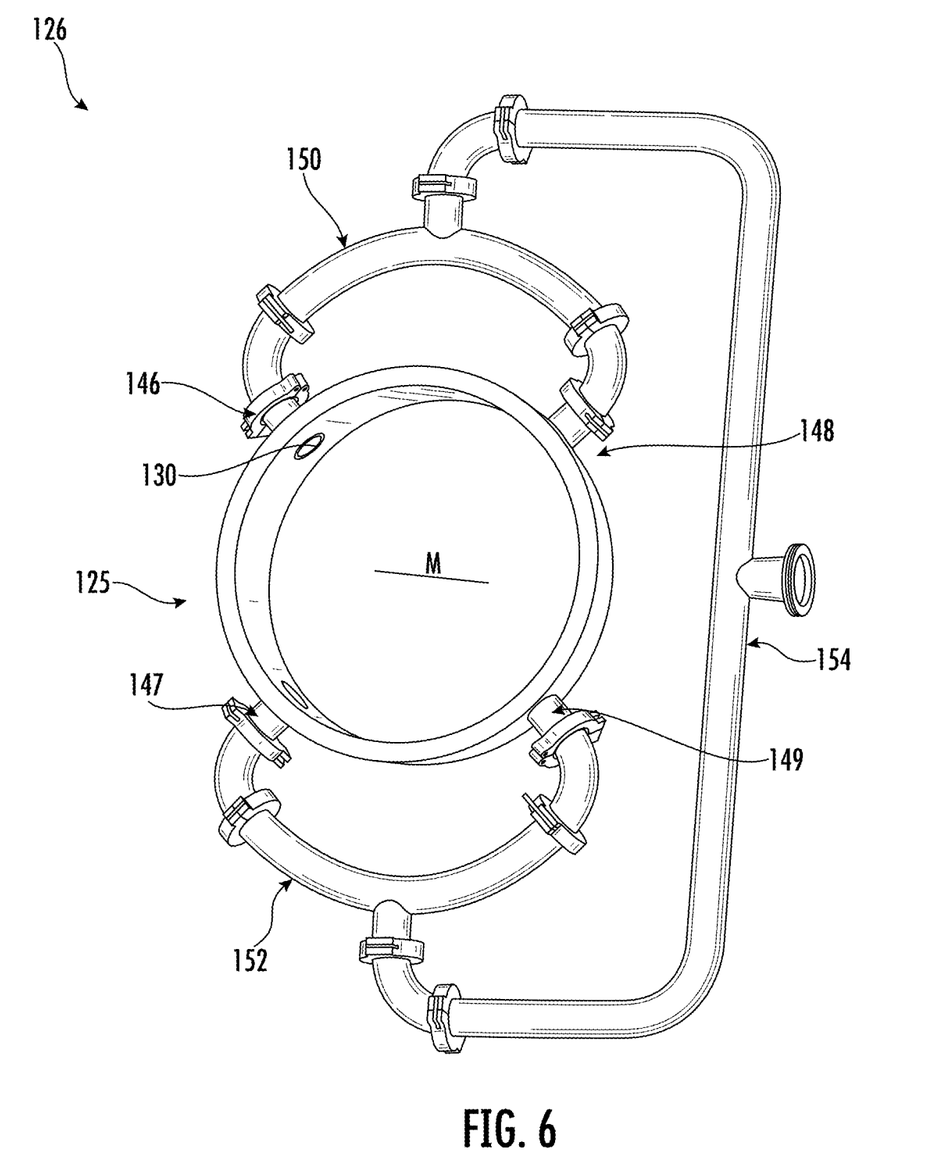
FIG. 6 is a perspective view of a second flange assembly in accordance with one or more embodiments of the present invention.

As shown in FIGS. 1, 5, and 6, the second tubular connector 124 may include a second flange assembly 126 having an interior surface 127 and an exterior surface 129. By way of example, the second flange assembly 126 include a second flange body 125, and the second flange body 125 may comprise stainless steel, aluminum, titanium, nickel, molybdenum, tungsten, or quartz. In some embodiments, the second flange body 125 may be substantially cylindrical. In other embodiments, the second flange body 125 may be substantially rectangular or have some other shape suitable for the application.

The second flange body 125 may define a plurality of through holes 130 extending between the interior surface 127 and the exterior surface 129. The second flange body 125 may further include a plurality of exit tubes 128 extending outward from the exterior surface 129 of the second flange body 125. Each of the exit tubes 128 may be aligned with a corresponding through hole 130, such that each of the exit tubes 128 is in fluid communication with the interior of the process chamber 102. In some embodiments, the plurality of through holes 130 may be arranged symmetrically around the second flange body 125. In other words, in some embodiments, each of the plurality of exit tubes 128 and corresponding through hole 130 is positioned opposite another of the plurality of exit tubes 128 and corresponding through hole 130 with respect to a midline M of the second flange assembly 126. The exit tubes 128, in turn, may be connected to a main gas outlet (not shown) that is configured to collect the at least one gas that is removed from the process chamber 102.

In some embodiments, as shown in FIG. 6, the plurality of exit tubes 128 may be configured such that the plurality of exit tubes 128 may be connected via a single tube 154. For example, a first exit tube 146 and a second exit tube 148 may be connected to a first intermediate tube 150 and a third exit tube 147 and a fourth exit tube 149 may be connected to a second intermediate tube 152. In some embodiments, as shown in FIG. 6, the first exit tube 146 is proximate the second exit tube 148 and the third exit tube 147 is proximate the fourth exit tube 149. In other embodiments, the first exit tube 146 and the second exit tube 148 may be opposite each other with respect to the midline M of the second flange body 125. Similarly, in such embodiments, and the third exit tube 147 and the fourth exit tube 149 may be opposite each other with respect to the midline M of the second flange body 125. The first intermediate tube 150 and a second intermediate tube 152 may then be connected to the single tube 154. In some embodiments, the first exit tube 146, the second exit tube 148, the third exit tube 147, and the fourth exit tube 149 may be of equal length. Similarly, in some embodiments, the first intermediate tube 150 and the second intermediate tube 152 may be of equal length. In this way, the removal of the at least one gas may be evenly distributed among the exit and intermediate tubes, helping to ensure substantially uniform and laminar flow of the at least one gas.

In other embodiments, rather than connecting to the single tube 154, the first intermediate tube 150 and the second intermediate tube 152 may be configured to connect to a first additional intermediate tube. The first additional intermediate and a second additional intermediate tube may then be configured to connect to a third additional intermediate tube. This process may be repeated until the last two intermediate tubes are connected to one tube. Moreover, although FIG. 6 depicts an embodiment in which four exit tubes connect in pairs to two intermediate tubes, which then connect to a single intermediate tube, one skilled in the art in view of this disclosure will understand that additional exit tubes or fewer exit tubes may connect to additional intermediate tubes or few intermediate tubes prior to or instead of connecting to the single tube.

As described above, the first flange assembly 110 may be configured to introduce the at least one gas into the process chamber 102 with minimal or no turbulence so as to enable uniform and laminar flow of the at least one gas over the substrate. This may be possible due to the configuration of the plurality of inlet tubes 112 and/or the plurality of outlet tubes 114. In some embodiments, as described above, each inlet tube 112 may be substantially perpendicular to a corresponding outlet tube 114. For example, as described above, the plurality of outlet tubes 114 may be circumferentially disposed along a length of the first flange body 109 and the plurality of inlet tubes 112 may be disposed circumferentially on, and extend radially outward from, the exterior surface 191 of the first flange body 109. In this way, as the at least one gas flows from the plurality of inlet tubes 112 into the plurality of outlet tubes 114 and into the process chamber 102, the direction of flow of the at least one gas when exiting the plurality of outlet tubes 114 is substantially tangential to the interior surface 190 of the first flange body 109. As a result, there will be minimal or no turbulence as the at least one gas enters the process chamber 102. In other words, the introduction of the at least one gas through the plurality of inlet tubes 112 and the plurality of outlet tubes 114 enables substantially uniform and laminar flow of the at least one gas over the substrate without the need for a substantial length of empty chamber between the introduction of the at least one gas and the substrate or a shower head disposed inside the process chamber 102.

Furthermore, in some embodiments as described above, the diameter of each outlet tube 114 may be greater than the diameter of each inlet tube 112. This enables the at least one gas to expand in a controlled manner as it flows from the plurality of inlet tubes 112 into the plurality of outlet tubes 114. The controlled expansion of the at least one gas as it moves from the plurality of inlet tubes 112 into the plurality of outlet tubes 114 allows there to be minimal or no turbulence as the at least one gas enters the process chamber 102. In other words, the controlled expansion of the at least one gas enables substantially uniform and laminar flow over the substrate without the need for a substantial length of empty chamber between the point of introduction of the at least one gas and the substrate or a shower head disposed within the process chamber 102.

Similarly, as described above, the second flange assembly 126 may be configured to remove the at least one gas from the process chamber 102 with minimal or no turbulence so as to enable substantially uniform and laminar flow of the at least one gas over the substrate, even proximate the point of removal of the gas. This may be possible due to the configuration of the plurality of through holes 130 and the plurality of exit tubes 128. In some embodiments, as described above, the plurality of through holes 130 may be arranged symmetrically around the second flange body 125. As a result, the removal of the at least one gas may be evenly distributed among the plurality of through holes 130 and corresponding exit tubes 128. Thus, the second flange assembly 126 is configured to cause minimal or no turbulence in removing the at least one gas from the process chamber 102. In other words, removal of the at least one gas through the plurality of through holes 130 and corresponding exit tubes 128 ensures substantially uniform and laminar flow over the substrate without the need for a substantial length of empty chamber between the substrate and the point of removal of the at least one gas.

In some embodiments, the first tubular connector 108 may further include a first O-ring 120 and the second tubular connector 124 may further include a second O-ring 134. The first O-ring 120 may be configured to maintain an airtight seal between the first tubular connector 108 and the heating enclosure 122. Similarly, the second O-ring 134 may be configured to maintain an airtight seal between the second tubular connector 124 and the heating enclosure 122. The first O-ring 120 and the second O-ring 134 may comprise any material capable of maintaining an airtight seal at the operating conditions (e.g., temperature and pressure) of the process chamber 102. By way of example, the first O-ring 120 and the second O-ring may comprise Kalrez® compounds, copper, Viton® compounds, or silicone.

In some embodiments, the first tubular connector 108 may further include first bellows 118 and the second tubular connector 124 may further include second bellows 132. By way of example, the first bellows 118 and the second bellows 132 may comprise stainless steel, aluminum, titanium, nickel, molybdenum, or tungsten. The first bellows 118 may be disposed between the first flange assembly 110 and the first O-ring 120. Similarly, the second bellows 132 may be disposed between the second flange assembly 126 and the second O-ring 134. In some embodiments, the first bellows 118 and the second bellows 132 may be flexible. As such, the first bellows 118 may be configured to mechanically isolate the first flange assembly 110 from the heating enclosure 122 and the second bellows 132 may be configured (e.g., sized and shaped) to mechanically isolate the second flange assembly 126 from the heating enclosure 122. For example, the first bellows 118 and the second bellows 132 may absorb vibrations of the heating enclosure 122, the first flange assembly 110, the second flange assembly 126, and/or upstream or downstream components of the CVD system 100. As a result, in some embodiments, the introduction of the at least one gas at the first flange assembly 110 and removal of the at least one gas at the second flange assembly 126 may not be affected by the vibrations of the heating enclosure 122. Similarly, as a result and in some embodiments, the heating enclosure 122 may not be affected by vibrations of the first flange assembly 110 and/or the second flange assembly 126.

The CVD system 100 may further include the heating enclosure 122. The heating enclosure 122 may be configured for containing the substrate during the CVD process and maintaining the necessary reactive temperature around the substrate during the CVD process. As shown in FIG. 1, the heating enclosure 122 may have a substantially rectangular cross-section. In other embodiments, the heating enclosure 122 may be substantially cylindrical and have a substantially circular cross-section, while in still other embodiments the heating enclosure 122 may have any other cross-sectional shape suitable for the application. The heating enclosure 122 may comprise any material capable of operating as part of the CVD system. For example, the heating enclosure 122 may comprise quartz, stainless steel, or aluminum. In some embodiments, the heating enclosure 122 may be surrounded by an insulator. In some embodiments, the insulator may comprise ceramic or insulating bricks.

As shown in FIG. 1, the CVD system 100 may further include a pump 140. The pump 140 may be connected to the plurality of exit tubes 128. The pump 140 may be configured to control the pressure in the process chamber 102. In some cases, for example, the pump 140 may be configured to control the pressure in the process chamber 102 such that the process chamber 102 is at substantially vacuum pressure while the CVD process is being performed. In other cases, for example, the pump 140 may be configured to control the pressure in the process chamber 102 such that the process chamber 102 is at substantially atmospheric pressure when the substrate is being received into the process chamber 102 and when the substrate is being discharged, or removed, from the process chamber 102. The pump 140 may be further configured to remove the at least one gas from the process chamber 102.

As shown in FIG. 1, the CVD system 100 may include a control cabinet 166. The control cabinet 166 may include a processor, a memory, and communications circuitry. The control cabinet 166 may be configured to allow a user or operator to control the operations of the CVD system 100. For example, the operator may access the control cabinet 166 to control the pressure in the process chamber 102. As another example, the operator may access the control cabinet 166 to control the temperature in the heating enclosure 122. In yet another example, the operator may access the control cabinet 166 to open and close the first gate valve 106 and the second gate valve 142. In yet another example, the operator may access the control cabinet 166 to initiate the introduction of the at least one gas into the process chamber 102.

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of the CVD system.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A flange assembly for introducing at least one gas into a chemical vapor deposition chamber, the flange assembly comprising:
   a flange body disposed proximate a chemical vapor deposition process chamber, wherein the flange body defines a length and has an interior surface and an exterior surface;
   a plurality of outlet tubes disposed on the interior surface of the flange body; and
   a plurality of inlet tubes disposed on the exterior surface of the flange body, each inlet tube having a first end and a second end, wherein each inlet tube is in fluid communication with a corresponding outlet tube via the second end of the inlet tube, wherein the first end of each inlet tube is configured to be connected to a supply of the at least one gas,
   wherein each outlet tube is configured to output the at least one gas into the chemical vapor deposition chamber for conducting a chemical vapor deposition process, and
   wherein the plurality of inlet tubes extends radially outward from the exterior surface of the flange body.

2. The flange assembly of claim 1, wherein the plurality of outlet tubes is circumferentially disposed on the interior surface of the flange body and extends along the length of the flange body.

3. The flange assembly of claim 1, wherein a diameter of each outlet tube is greater than a diameter of each inlet tube.

4. The flange assembly of claim 3, wherein the diameter of each outlet tube is at least two times the diameter of each inlet tube.

5. The flange assembly of claim 1, wherein each outlet tube defines a first end and a second end, and wherein each outlet tube is configured to output the at least one gas into the chemical vapor deposition chamber via an opening at the second end.

6. The flange assembly of claim 1, further comprising flexible bellows engaged with the flange body.

7. The flange assembly of claim 1, further comprising an O-ring engaged with the flange body.

8. A chamber for conducting chemical vapor deposition, the chamber comprising:
   a heating enclosure configured to maintain a substrate at a predefined temperature for conducting a chemical vapor deposition process within the chamber, wherein the heating enclosure comprises a body having a first end and a second end;
   a first flange body disposed proximate the first end of the body of the heating enclosure and configured to introduce at least one gas into the chamber, wherein the first flange body defines a length and has an interior surface and an exterior surface;
   a plurality of outlet tubes disposed on the interior surface of the first flange body;
   a plurality of inlet tubes disposed on the exterior surface of the first flange body, each inlet tube having a first end and a second end, wherein each inlet tube is in fluid communication with a corresponding outlet tube via the second end of the inlet tube, wherein the first end of each inlet tube is configured to be connected to a supply of the at least one gas, wherein each outlet tube is configured to output the at least one gas into the chamber proximate the first end of the body of the heating enclosure, and wherein the plurality of inlet tubes extends radially outward from the exterior surface of the first flange body;
   a second flange body disposed proximate the second end of the body of the heating enclosure and configured to remove the at least one gas from the chamber, wherein the second flange body has an interior surface and an exterior surface and defines a plurality of through holes between the interior surface and the exterior surface; and
   a plurality of exit tubes extending from the exterior surface of the second flange body, wherein each of the exit tubes is aligned with a corresponding one of the plurality of through holes so as to be in fluid communication with an interior of the chamber,
   wherein at least one of the plurality of exit tubes and corresponding through hole is positioned opposite another one of the plurality of exit tubes and corresponding through hole with respect to a midline of the second flange body, and
   wherein the first flange body and the second flange body are configured to facilitate substantially uniform and laminar flow of the at least one gas over the substrate.

9. The chamber of claim 8, wherein a diameter of each outlet tube is greater than a diameter of each inlet tube.

10. The chamber of claim 8, wherein the plurality of outlet tubes is circumferentially disposed on the interior surface of the first flange body and extends along the length of the first flange body.

11. The chamber of claim 8, wherein each outlet tube is further configured to output the at least one gas into the chamber via an opening at a second end.

12. The chamber of claim 8, further comprising first flexible bellows engaged with the first flange body and second flexible bellows engaged with the second flange body.

13. The chamber of claim 8, further comprising a first O-ring engaged with the first flange body and a second O-ring engaged with the second flange body.

14. The chamber of claim 8, wherein at least one of the plurality of exit tubes is connected to another one of the plurality of exit tubes via a first intermediate tube and wherein the first intermediate tube is in fluid communication with a pump.

15. The flange assembly of claim 1, wherein the plurality of outlet tubes extends along the length of the flange body such that the at least one gas flows parallel to the length of the flange body.

16. The flange assembly of claim 1, wherein the flange body is cylindrical.

17. The flange assembly of claim 1, wherein the diameter of each outlet tube of the plurality of outlet tubes varies along the length of the outlet tube, and wherein the diameter of each inlet tube of the plurality of inlet tubes varies along the length of the inlet tube.

18. The chamber of claim 8, wherein the plurality of outlet tubes extends along the length of the first flange body such that the at least one gas flows parallel to the length of the first flange body.

19. The chamber of claim 8, wherein the first flange body is cylindrical.

20. The chamber of claim 8, wherein the diameter of each outlet tube of the plurality of outlet tubes varies along the length of the outlet tube, and wherein the diameter of each inlet tube of the plurality of inlet tubes varies along the length of the inlet tube.

* * * * *

UNITED STATES PATENT AND TRADEMARK OFFICE
CERTIFICATE OF CORRECTION

| | | |
|---|---|---|
| PATENT NO. | : 12,221,695 B2 | Page 1 of 1 |
| APPLICATION NO. | : 17/305209 | |
| DATED | : February 11, 2025 | |
| INVENTOR(S) | : Elad Mentovich et al. | |

It is certified that error appears in the above-identified patent and that said Letters Patent is hereby corrected as shown below:

On the Title Page

Under Item (73):
Please change the CITY information for Assignee BAR-ILAN UNIVERSITY to Ramat Gan (IL)

Signed and Sealed this
Eighteenth Day of March, 2025

Coke Morgan Stewart
*Acting Director of the United States Patent and Trademark Office*